US010927452B2

(12) United States Patent
Musayev et al.

(10) Patent No.: US 10,927,452 B2
(45) Date of Patent: Feb. 23, 2021

(54) SUBSTRATE HAVING AN INTERMEDIATE COATING AND A CARBON COATING

(71) Applicant: Schaeffler Technologies AG & Co. KG, Herzogenaurach (DE)

(72) Inventors: Yashar Musayev, Nuremberg (DE); Edgar Schulz, Langensendelbach (DE); Joanna Procelewska, Erlangen (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 293 days.

(21) Appl. No.: 15/573,144

(22) PCT Filed: Apr. 13, 2016

(86) PCT No.: PCT/DE2016/200182
§ 371 (c)(1),
(2) Date: Nov. 10, 2017

(87) PCT Pub. No.: WO2016/180412
PCT Pub. Date: Nov. 17, 2016

(65) Prior Publication Data
US 2018/0127869 A1 May 10, 2018

(30) Foreign Application Priority Data
May 11, 2015 (DE) .......................... 102015208644.5

(51) Int. Cl.
*C23C 14/22* (2006.01)
*C23C 14/06* (2006.01)
(Continued)

(52) U.S. Cl.
CPC .......... *C23C 16/0281* (2013.01); *C23C 16/26* (2013.01); *B32B 15/04* (2013.01);
(Continued)

(58) Field of Classification Search
None
See application file for complete search history.

(56) References Cited

U.S. PATENT DOCUMENTS 4,929,500 A * 5/1990 Yamashita ............... G11B 5/72
204/192.1
5,538,799 A 7/1996 Nanya
(Continued)

FOREIGN PATENT DOCUMENTS

CN 1890398 A 1/2007
CN 1982020 A 6/2007
(Continued)

OTHER PUBLICATIONS

Yanlong, Guo et al, Research Progress of Nonmetal Doped Diamond-Like Carbon Films, www.opticsjournal.net, 5 pages, 2009, China.
(Continued)

*Primary Examiner* — Xiaobei Wang
(74) *Attorney, Agent, or Firm* — Kevin Parks

(57) ABSTRACT

Components suitable for chemically aggressive environments are disclosed, as well as methods for producing the components. One component may include a substrate having at least one surface having a layer system, which may include an amorphous carbon layer. The layer system may include at least one metallic intermediate layer which is arranged between the substrate and the amorphous carbon layer. The metallic intermediate layer may include titanium, a titanium alloy, nickel, or a nickel alloy. A two-layer bonding layer may be arranged between the at least one intermediate layer and the substrate and a first bonding layer composed of NiP. A second bonding layer composed of a nickel-chromium alloy or a nickel-vanadium alloy may also be present. The amorphous carbon layer may form an outer layer of the layer system facing away from the substrate and
(Continued)

may comprise at least one amorphous hydrogen-containing carbon layer.

19 Claims, 1 Drawing Sheet

(51) Int. Cl.
*C23C 16/26* (2006.01)
*B32B 15/04* (2006.01)
*C23C 16/02* (2006.01)
*C25D 3/12* (2006.01)
*C25D 3/56* (2006.01)
*C22C 19/00* (2006.01)
*C22C 19/03* (2006.01)

(52) U.S. Cl.
CPC ............ *C22C 19/007* (2013.01); *C22C 19/03* (2013.01); *C23C 14/0605* (2013.01); *C23C 14/228* (2013.01); *C25D 3/12* (2013.01); *C25D 3/562* (2013.01); *Y10T 428/12625* (2015.01)

(56) References Cited

U.S. PATENT DOCUMENTS

| | | |
|---|---|---|
| 5,763,087 A | 6/1998 | Falabella |
| 2003/0094869 A1 | 5/2003 | Ameen et al. |
| 2007/0141383 A1* | 6/2007 | Chen ................. C23C 28/321 428/627 |
| 2011/0021390 A1* | 1/2011 | Mori ................. C10M 163/00 508/105 |
| 2015/0037710 A1* | 2/2015 | Cooke ................. C23C 14/352 429/518 |
| 2015/0361571 A1* | 12/2015 | Miettinen ................. C25D 3/06 428/680 |

FOREIGN PATENT DOCUMENTS

| | | |
|---|---|---|
| CN | 103046001 A | 4/2013 |
| CN | 104204274 B | 2/2018 |
| DE | 3630418 C1 | 12/1987 |
| EP | 1251192 A2 | 10/2002 |
| EP | 1470263 B1 | 10/2004 |

OTHER PUBLICATIONS

Lanigan J, et al Tribochemistry of silicon and oxygen doped, hydrogenated Diamond-like Carbon in fully-formulated oil against low additive oil, Tribology International, 2015, pp. 431-442, vol. 82, Elsevier, UK.

Chinese Office Action for CN107532292; 8 pgs; dated Jul. 30, 2019 by Chinese Intellectual Property Office.

* cited by examiner

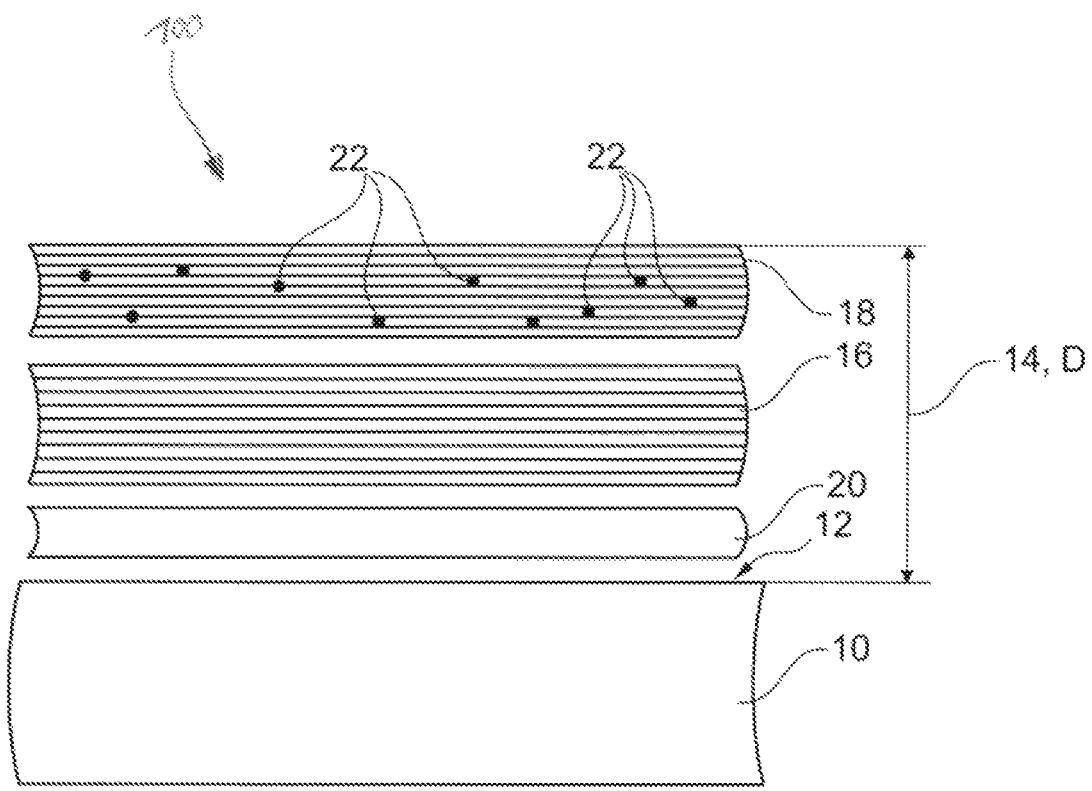

SUBSTRATE HAVING AN INTERMEDIATE COATING AND A CARBON COATING

CROSS-REFERENCE TO RELATED APPLICATIONS

This application is the U.S. National Phase of PCT Appln. No. PCT/DE2016/200182 filed Apr. 13, 2016, which claims priority to DE 102015208644.5 filed May 11, 2015, the entire disclosures of which are incorporated by reference herein.

TECHNICAL FIELD

The present disclosure relates to a component comprising a substrate having at least one surface which is provided with a layer system, where the layer system comprises at least one amorphous carbon layer. The present disclosure also relates to the use of the component and to a process for producing the component.

BACKGROUND

Components having a layer system as mentioned at the outset are employed in various fields of industry. Thus, layer systems which have tribological properties, e.g. wear resistance or corrosion resistance, in order to ensure these properties for high-performance components, for example for highly stressed chain drive components, roller bearing components, engine elements and tools, are known from the prior art.

CN 103046001 A describes a tribologically effective layer system having a titanium layer, a carbon-titanium transition layer and an amorphous carbon layer.

Depending on the application, these layers consist of a hard material layer or carbon layer which are applied by means of known PVD or PACVD processes to the components.

The PVD or PACVD process is known in many fields of industry and leads to a considerable improvement in the tribological properties, for example to improved wear resistance and reduction in friction, of the coated components. However, in the case of use in chemically aggressive media, the substrate material itself has to be sufficiently corrosion-resistant. In order to achieve good economics, the components are then usually made of low-alloy, corrosion-resistant materials. However, these technologies have the disadvantage that for the components they are firstly not sufficient to ensure reliable protection against wear in the case of increasing stress and secondly they do not offer satisfactory corrosion protection in chemically aggressive media.

SUMMARY

It is therefore an object of the present disclosure to further develop a component comprising a substrate having at least one surface which is provided with a layer system, where the layer system comprises at least one amorphous carbon layer, in such a way that it is protected against tribological stress and in particular ensures reliable and ongoing wear protection in a chemically aggressive environment.

This object may be achieved by a component having the features disclosed herein. The component may be corrosion- and wear-resistant and suitable for applications involving extreme tribological stress in chemically aggressive environmental conditions.

A further object of the present disclosure is to indicate a use of such a component so that the component is protected against tribological stress during use and, in particular, ensures reliable and ongoing wear protection during such use.

This object may be achieved by a use of the component of the disclosure comprising the additional features described herein.

A further object of the present disclosure is to provide a reliable and economical process for producing the component which is suitable for mass production.

This object may be achieved by a process for producing the component of the disclosure which comprises the features disclosed herein. The component formed in this way can be used reliably under high tribological stress and is resistant to chemically aggressive environments.

The component of the disclosure comprises a substrate having at least one surface which is provided with a layer system, where the layer system comprises at least one amorphous carbon layer. The layer system additionally has at least one metallic intermediate layer which is arranged between the substrate and the at least one amorphous carbon layer. The at least one amorphous carbon layer forms an outer layer of the layer system facing away from the substrate and comprises at least one amorphous hydrogen-containing carbon layer.

The amorphous carbon layer forms a tribologically functional layer. In particular, the amorphous hydrogen-containing carbon layer, here also referred to as a-C:H layer, may be a DLC layer (DLC=diamond-like carbon).

The amorphous hydrogen-containing carbon layer may have a hydrogen content in the range from 10 to 25%, such as from 15 to 20%. Here and below, percentages indicated for alloy constituents are in atom percent.

In one embodiment of the component of the disclosure, the amorphous hydrogen-containing carbon layer is a modified hydrogen-containing amorphous carbon layer which comprises a doping element which is formed by a metal or a nonmetal.

Metal-containing amorphous hydrogen-containing carbon layers, here also referred to as a-C:H:Me layers, may be formed using at least one doping element from transition groups 4 to 11 of the Periodic Table. As a result of doping with a metal, the amorphous carbon layer of the layer system has, for example, a high wear resistance, a low coefficient of friction and improved adhesion to adjacent layers. The material of properties of the layer system can be strongly influenced by a change in the metal content.

Amorphous hydrogen-containing carbon layers containing nonmetals, here also referred to as a-C:H:X layers, are preferably formed using at least one doping element from the group consisting of silicon, oxygen, nitrogen, fluorine, and boron. Doping of a hydrogen-containing amorphous carbon layer with a nonmetal likewise makes it possible to modify the desired properties of the layer system to a great extent. For example, silicon increases the heat resistance in an oxygen-containing environment. Doping with silicon and oxygen can greatly reduce the surface energy (down to values in the order of those of PTFE). In addition, transparent and extremely scratch-resistant layers can be produced.

In a further embodiment of the component of the disclosure, the at least one amorphous carbon layer can also comprise two amorphous carbon layers, with a first amorphous hydrogen-containing carbon layer and a further modified amorphous hydrogen-containing carbon layer comprising doping elements being present. Here, the first carbon layer or the second carbon layer can form the outer layer of the layer system.

In another embodiment of the disclosure, the at least one metallic intermediate layer consists of titanium, a titanium alloy, nickel, or a nickel alloy. In particular, an intermediate layer may be formed by a titanium-nickel alloy or a titanium-nickel-vanadium alloy.

Thus, the good tribological properties of a, for example, PVD coating are utilized in combination with a titanium- and/or nickel-alloyed intermediate layer in order to be able to equip highly tribologically stressed components in an aggressive environment. The proportions of the alloy partners (e.g. titanium/nickel 40/60%) are achieved by targeted deposition processes. Here, the optimal layer composition which, depending on the tribological system, ensures a maximum degree of corrosion protection is determined by use of additional simulation tools.

Preference may be given to a total layer thickness D of the layer system being in the range from 2 to 100 µm, such as from 2 to 50 µm, or from 2 to 25 µm.

In another embodiment of the component, at least one bonding layer which is arranged between the at least one intermediate layer and the substrate is additionally present. The bonding layer can improve the adhesion of the intermediate layer, improve the durability of the layer system and/or the corrosion resistance of the component. The at least one bonding layer may be formed by a metal or a metal alloy, where a composition of the at least one bonding layer differs from a composition of the at least one intermediate layer.

The substrate of the component is formed by, for example, steel, such as heat-treated steel.

In such a case, nickel alloys, preferably nickel-chromium alloys or nickel-vanadium alloys, have been found to be particularly useful as bonding layer. These compositions serve, in particular, to improve the adhesion of the layer system to the surface of the substrate. Furthermore, a nickel-phosphorus alloy has also been found to be useful as bonding layer. The nickel-phosphorus alloy (NiP) preferably has a phosphorus content of greater than 10%, preferably in the range from 12 to 15%. In particular, an amorphous NiP layer is formed. Such bonding layers composed of NiP serve less as bonding agents but as additional corrosion protection for the substrate.

In one embodiment of the component, an at least two-layer bonding layer which has, adjoining the substrate, a first bonding layer composed of NiP and on top of this a second bonding layer composed of a nickel-chromium alloy or nickel-vanadium alloy which adjoins the intermediate layer is provided. This multilayer bonding layer ensures good adhesion of the layer system to the substrate and at the same time improves the corrosion protection for the substrate.

A component comprising a substrate composed of steel and a layer system, where the layer system has, starting out from the substrate in this order, an optional metallic bonding layer composed of NiV or NiCr, a metallic intermediate layer composed of a titanium-nickel alloy, in particular a titanium-nickel-chromium alloy or a titanium-nickel-vanadium alloy, and has an amorphous hydrogen-containing carbon layer, has been found to be corrosion- and wear-resistant.

A component comprising a substrate composed of steel and a layer system, where the layer system has, starting out from the substrate in this order, a multilayer bonding layer composed of a first bonding layer composed of NiP and a second bonding layer composed of NiV or NiCr, a metallic intermediate layer composed of a titanium-nickel alloy, in particular a titanium-nickel-chromium alloy or a titanium-nickel-vanadium alloy, and has an amorphous hydrogen-containing carbon layer, has been found to be particularly corrosion- and wear-resistant.

The process of the disclosure for producing a component according to the disclosure may include the following steps:
optional deposition of the at least one bonding layer;
deposition of the at least one metallic intermediate layer on the surface of the substrate or the at least one optional bonding layer; and
deposition of the at least one amorphous carbon layer comprising the at least one amorphous hydrogen-containing carbon layer on the at least one metallic intermediate layer.

The at least one optional bonding layer and/or the at least one metallic intermediate layer and/or the at least one amorphous carbon layer comprising the at least one amorphous hydrogen-containing carbon layer are preferably deposited by means of PVD or PACVD.

As an alternative, the at least one metallic intermediate layer, optionally also the at least one optional bonding layer, is deposited by means of electrochemical deposition and/or by means of thermal spraying and, furthermore, the at least one amorphous carbon layer comprising the at least one amorphous hydrogen-containing carbon layer may be deposited by means of PVD or PACVD.

A first embodiment of the process of the disclosure can also provide for the metallic intermediate layer to consist of titanium, a titanium alloy, nickel, or a nickel alloy and be applied to the substrate by means of PVD or PACVD using individual targets and/or mosaic targets.

The component comprising the above-described layer system comprising at least one amorphous hydrogen-containing carbon layer has excellent tribological properties. In addition, this layer system ensures not only reliable and long-term wear protection for the component but also, owing to the at least one metallic intermediate layer, optionally on at least one bonding layer, corrosion protection in a chemically aggressive environment. For the present purposes, chemically aggressive environments are, for example, hydrocarbons, solvents, organic solutions, seawater, acids, alkalis, etc.

Thus, the disclosure can also be employed for highly stressed machine elements. These include, for example, shafts or roller bearings which are exposed to a chemically aggressive environment. The disclosure can likewise be employed for specific applications which impose particular demands on the surfaces, for instance when there is a lack of lubrication or intrusion of media in a roller bearing, in particular in the food or pharmaceuticals industry, and in bearings for dental drills, turbochargers, spindle bearings, pumps, underwater turbines or the like. A further advantage of the disclosure may be that the layer systems described here can be realized appropriately easily and economically from a plant-technological (e.g.: in-line plant) and process point of view, so that production of a corrosion- and wear-resistant component which is suitable for mass production and is reliable in terms of the process is possible by means of the process of the disclosure.

BRIEF DESCRIPTION OF THE DRAWINGS

Examples of the disclosed components and their advantages will be described in more detail below with the aid of the accompanying FIGURE. The size ratios in the FIGURE do not correspond to the actual size ratios since the layers of the layer system are depicted individually and in simplified form in an exploded view. In the FIGURE:

FIG. 1 shows a partial sectional view of a component in which a surface of the substrate is provided with a layer system according to an embodiment of the disclosure.

DETAILED DESCRIPTION

FIG. 1 shows a partial sectional view of a component 100 which comprises a substrate 10 composed of steel and a layer system 14. A surface 12 of the substrate 10 is provided with the layer system 14 according to the disclosure, with a bonding layer 20 applied directly to the surface 12 of the substrate 10 being depicted here. The bonding layer 20 is only optionally present and is not absolutely necessary. Furthermore, a metallic intermediate layer 16 which has been applied directly to the surface 12 of the substrate 10 or to the bonding layer 20 which is optionally present is provided. Furthermore, an outer layer 18 in the form of a tribologically functional, amorphous hydrogen-containing carbon layer is present and is arranged facing away from the substrate 10. The metallic bonding layer in this embodiment consists of, for example, a nickel-vanadium alloy. However, the bonding layer can also be made up of a number of layers and, in particular, comprise a first bonding layer, for example composed of NiP, and a second bonding layer, for example composed of NiCr.

The metallic intermediate layer 16 preferably consists of titanium, a titanium alloy, nickel or a nickel alloy. Here, an intermediate layer 16 composed of a titanium-nickel-vanadium alloy is used. In the production of the layers of the layer system 14 by means of PVD or PACVD, it is possible to use individual targets or else mosaic targets. In one embodiment, the tribologically functional amorphous hydrogen-containing carbon layer is a modified hydrogen-containing amorphous carbon layer. The layer system 14 formed on the component 100 here has a total layer thickness D of 25 μm.

The depicted embodiment of the component is merely an example of how the component of the disclosure and also the production process according to the disclosure can be configured. Thus, a bonding layer can be omitted entirely or a plurality of bonding layers of different compositions can be provided on the substrate. Furthermore, a plurality of metallic intermediate layers can be present. Finally, it is also possible for a plurality of amorphous carbon layers comprising at least one amorphous hydrogen-containing carbon layer to be present.

LIST OF REFERENCE SYMBOLS

100 component
10 substrate
12 surface
14 layer system
16 metallic intermediate layer
18 outer layer
20 bonding layer
22 doping element
D total layer thickness

The invention claimed is:

1. A component comprising a substrate having at least one surface which is provided with a layer system, where the layer system comprises at least one amorphous carbon layer, wherein the layer system further comprises at least one metallic intermediate layer which is arranged between the substrate and the at least one amorphous carbon layer, where the at least one metallic intermediate layer includes titanium, a titanium alloy, nickel, or a nickel alloy, and furthermore a separate two-layer bonding layer, which is arranged between the at least one metallic intermediate layer and the substrate, is present and includes a first amorphous single phase bonding layer composed of NiP adjoining the substrate and, on top of the first amorphous single phase bonding layer, a second bonding layer composed of a nickel-chromium alloy or a nickel-vanadium alloy, and wherein the at least one amorphous carbon layer forms an outer layer of the layer system facing away from the substrate and comprises at least one amorphous hydrogen-containing carbon layer.

2. The component as claimed in claim 1, wherein the at least one amorphous hydrogen-containing carbon layer comprises a doping element which is formed by a metal or a nonmetal.

3. The component as claimed in claim 1, wherein the amorphous hydrogen-containing carbon layer has a hydrogen content in the range from 10 to 25 at.-%.

4. The component as claimed in claim 1, wherein a total layer thickness of the layer system is in the range from 2 μm to 100 μm.

5. The component as claimed in claim 1, wherein the substrate is made from steel.

6. The component as claimed in claim 1, wherein the at least one metallic intermediate layer is made from a titanium-nickel alloy.

7. A device comprising:
the component as claimed in claim 1; and
a friction partner, wherein the component acts at least in a region of the layer system in combination with the friction partner in a chemically aggressive environment.

8. A process for producing the component as claimed in claim 1, comprising:
depositing the two-layer bonding layer on the substrate;
depositing the at least one metallic intermediate layer on the two-layer bonding layer; and
depositing the at least one amorphous carbon layer comprising the at least one amorphous hydrogen-containing carbon layer on the at least one metallic intermediate layer.

9. The process as claimed in claim 8, wherein the two-layer bonding layer, the at least one metallic intermediate layer, or the at least one amorphous carbon layer comprising the at least one amorphous hydrogen-containing carbon layer are deposited by means of PVD or PACVD.

10. The process as claimed in claim 8, wherein the at least one metallic intermediate layer and the two-layer bonding layer are deposited by electrochemical deposition or by thermal spraying and the at least one amorphous carbon layer comprising the at least one amorphous hydrogen-containing carbon layer is deposited by PVD or PACVD.

11. A component comprising:
a substrate comprising a surface; and
a layer system adhered to the surface, the layer system comprising:
a two-layer bonding layer comprising:
a first amorphous single phase bonding layer including a nickel-phosphorous alloy adjoining the substrate; and
a second bonding layer including a nickel-chromium alloy or a nickel-vanadium alloy;

a metallic intermediate layer including titanium, a titanium alloy, nickel, or a nickel alloy; and an amorphous carbon layer forming an outer layer facing away from the substrate and including an amorphous hydrogen-containing carbon layer.

12. The component of claim 11, wherein the amorphous hydrogen-containing carbon layer comprises a doping element which is formed by a metal or a nonmetal.

13. The component of claim 11, wherein the amorphous hydrogen-containing carbon layer has a hydrogen content of 15 to 20 at.-%.

14. The component of claim 11, wherein a total layer thickness of the layer system is between 2 μm and 100 μm.

15. The component of claim 11, wherein the substrate is made from steel.

16. The component of claim 11, wherein the metallic intermediate layer includes a titanium-nickel alloy.

17. A process for producing the component of claim 11, comprising:
depositing the two-layer bonding layer onto the substrate;
depositing the metallic intermediate layer onto the two-layer bonding layer; and
depositing the amorphous carbon layer onto the metallic intermediate layer.

18. The process of claim 17, wherein the two-layer bonding layer, the metallic intermediate layer, or the amorphous carbon layer is deposited by physical vapor deposition (PVD) or plasma assisted chemical vapor deposition (PACVD).

19. The process of claim 17, wherein:
the metallic intermediate layer or the two-layer bonding layer is deposited by electrochemical deposition or thermal spraying; and
the amorphous carbon layer is deposited by means of physical vapor deposition (PVD) or plasma assisted chemical vapor deposition (PACVD).

* * * * *